United States Patent
Yamagishi

(10) Patent No.: US 10,968,880 B1
(45) Date of Patent: Apr. 6, 2021

(54) KICKBACK-LIMITED SOFT-SHUTDOWN CIRCUIT FOR A COIL

(71) Applicant: SEMICONDUCTOR COMPONENTS INDUSTRIES, LLC, Phoenix, AZ (US)

(72) Inventor: Mikio Yamagishi, Fukaya (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/848,033

(22) Filed: Apr. 14, 2020

(51) Int. Cl.
*F02P 9/00* (2006.01)
(52) U.S. Cl.
CPC .................... *F02P 9/002* (2013.01)
(58) Field of Classification Search
CPC ............ F02P 9/002; F02P 3/04; F02P 3/055
USPC ................. 123/604, 605, 630, 632
See application file for complete search history.

(56) References Cited

U.S. PATENT DOCUMENTS

| 9,800,024 B2 | 10/2017 | Obe et al. |
| 2019/0136820 A1 | 5/2019 | Yamagishi |
| 2019/0190238 A1* | 6/2019 | Yamamoto ............. F02P 3/055 |
| 2020/0116118 A1* | 4/2020 | Yamagishi ............. H02P 13/00 |

* cited by examiner

Primary Examiner — Hai H Huynh
(74) Attorney, Agent, or Firm — Brake Hughes Bellermann LLP

(57) ABSTRACT

Circuits and methods for controlling a coil current are disclosed. The control utilizes current sources to source/sink charge to/from a capacitance of a switching device to turn the switching device ON/OFF. When turned OFF, the switching device blocks coil current from flowing, which can create a large kickback voltage on the coil. To reduce the large kickback voltage, the capacitance can be discharged slowly by a small discharge current. The disclosed circuits and methods provide a gradual reduction of the coil current at a rate that is slow enough to prevent a spark while minimizing a period for shutdown to prevent overheating. The disclosed systems and methods may be simpler than other approaches because the soft shutdown is no ramp signal is required for the reduction. Instead, a rate of gate capacitance discharge is controlled to maintain the kickback voltage at a particular level.

21 Claims, 8 Drawing Sheets

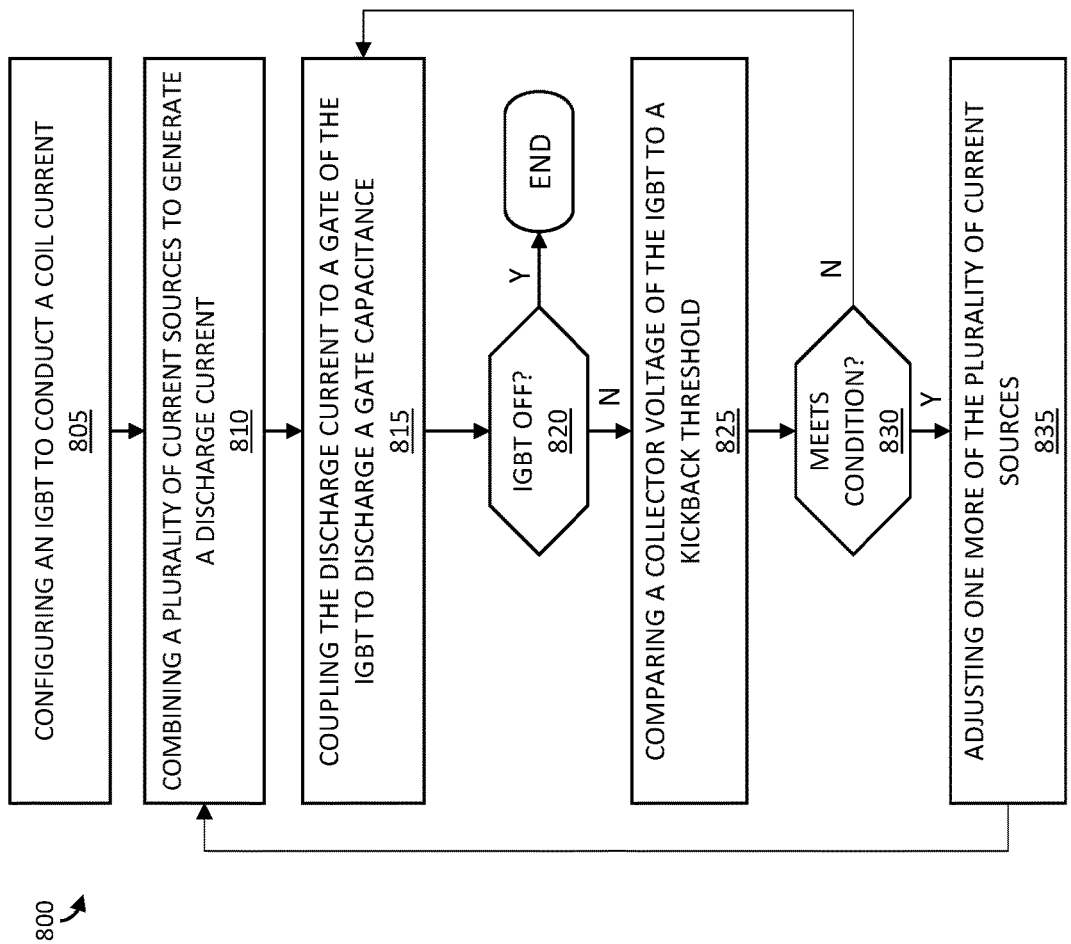

KICKBACK-LIMITED SOFT-SHUTDOWN CIRCUIT FOR A COIL

FIELD OF THE DISCLOSURE

The present disclosure relates to ignition systems and more specifically to a circuit and method for limiting a kickback voltage to prevent a spark when discharging a charged coil.

BACKGROUND

An ignition system includes circuitry to create a spark to ignite combustion in a combustion engine (e.g., of a vehicle). Coil shutdown may not be performed in a desirable fashion within such ignition systems. It is in this context that implementations of the present invention arise.

SUMMARY

In at least one aspect, the present disclosure generally describes a circuit. The circuit includes a coil that is configured to conduct a coil current from a battery to a ground. The circuit further includes a switching device that is coupled between the coil and the ground. The circuit further includes a coil current controller that includes a plurality of current sources that can be coupled or decoupled to a controlling terminal of the switching device to adjust a level of the coil current. The circuit further includes a collector monitor circuit that monitors a voltage corresponding to a kickback voltage of the coil during a soft shutdown of the coil current and adjust current from one or more of the plurality of current sources to limit the kickback voltage of the coil.

In another aspect, the present disclosure generally describes a method for shutting down a coil current in a coil. The method includes configuring an insulated gate bipolar transistor (IGBT) to conduct the coil current. The method also includes combining a plurality of current sources to generate a discharge current. The method also includes coupling the discharge current to a gate of the IGBT to discharge a gate capacitance. The method also includes reducing the coil current conducted by the IGBT according to discharge of the gate capacitance, and while the coil current is being reduced, comparing a collector voltage of the IGBT to a kickback threshold voltage to obtain a comparison. The method also includes adjusting, based on the comparison, one or more of the plurality of current sources to change the discharge current in order to limit a kickback voltage of the coil.

In another aspect, the present disclosure generally describes an ignition system. The ignition system includes an ignition assembly that includes a primary coil inductively coupled to a secondary coil that is in series with a spark gap. The ignition system further includes an IGBT coupled between the primary coil and a ground. The IGBT is configurable to control a coil current in the primary coil. The ignition system further includes a coil-current controller that includes a plurality of switches that are configured to coupling a plurality of current sources to a gate of the IGBT during a soft shutdown of the coil current. The plurality of current sources combine to generate a discharge current in order to reduce a gate voltage on a gate capacitance of the IGBT over a soft shutdown period, where the coil current corresponds to the voltage on the gate capacitance.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 8 is a flowchart of a method for shutting down a current in a coil according to an implementation of the present disclosure.

The components in the drawings are not necessarily to scale relative to each other. Like reference numerals designate corresponding parts throughout the several views.

DETAILED DESCRIPTION

Figure 1:
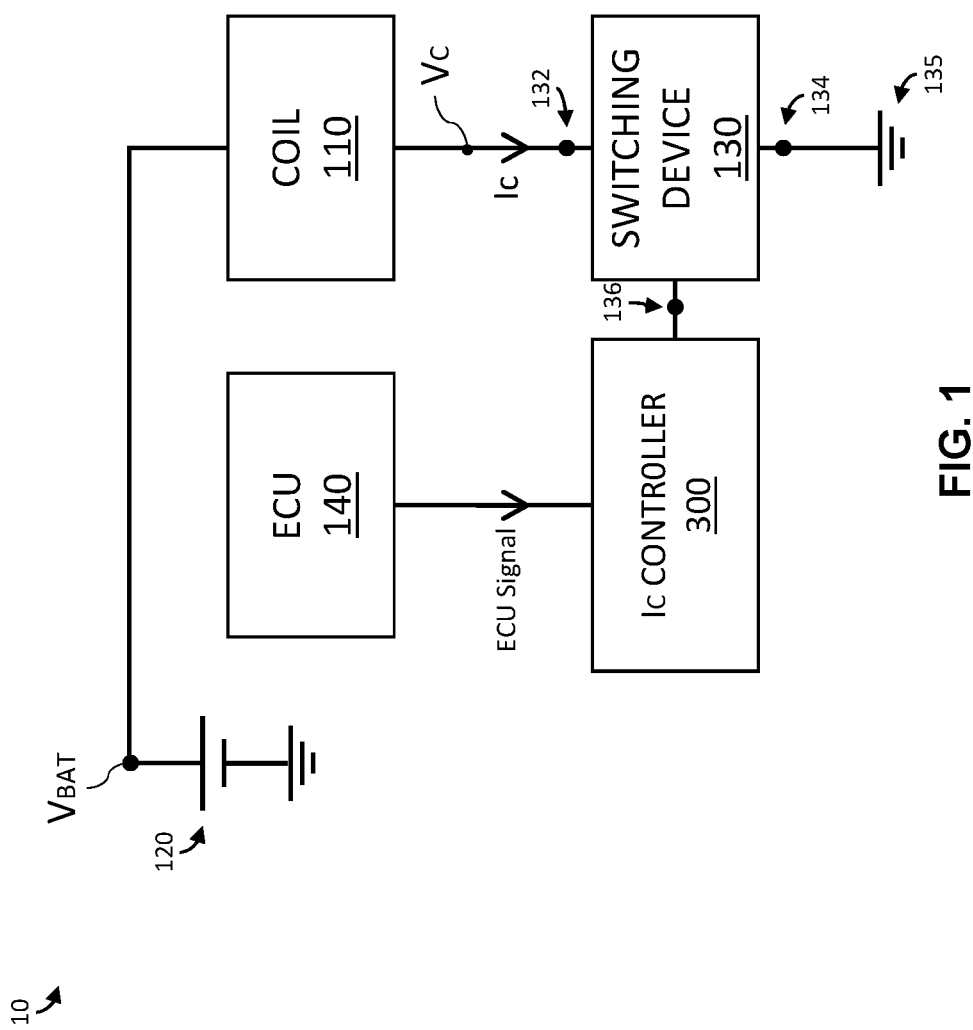
FIG. 1 is a block diagram of a system for charging and discharging a coil.

An ignition system includes circuitry to create a spark to ignite combustion in a combustion engine (e.g., of a vehicle). The circuitry includes a primary coil connected in series between a voltage source (e.g., a battery) and a switching device. The primary coil is inductively coupled to a secondary coil that is in series with a spark gap. When the switching device is configured to conduct (i.e., is turned ON), the primary coil is charged by a coil current flowing from the voltage source and through the primary coil and the switching device to a ground. After the coil is charged, the switching device may be configured (i.e., turned OFF) to block the coil current. The abrupt change in the coil current creates a large voltage (i.e., kickback voltage) across the primary coil. This large voltage is transformed by a windings-ratio between the primary and secondary coil and can be large enough to generate a spark at the spark gap.

The electronic processes of a vehicle can be monitored and controlled by an engine control unit (ECU). For example, the ECU may generate a first signal (i.e., a rising edge) to begin charging the coil and a second signal (e.g., a falling edge) to trigger the spark. The period between the first signal and the second signal is known as a dwell period. If the dwell period is too long (i.e., over-dwell), overheating of the circuitry (e.g., the coil, the switching device) may occur. Accordingly, an over-dwell may trigger a discharge of the coil to prevent damage (e.g., thermal damage) to the switching device.

Because the timing of the triggered discharge may not be aligned with the timing of the combustion engine (i.e., engine), circuitry can be configured to discharge the coil gradually to prevent a spark. This gradual discharge of the coil is known as a soft shutdown (SSD). During a soft shutdown, the coil current in the primary coil is gradually reduced by a soft shut circuit to minimize the kickback voltage created by the changing current (i.e., $V=L \cdot dI/dt$). One such soft shutdown circuit is described in U.S. patent application Ser. No. 16/674,560, entitled, "CIRCUIT AND METHOD FOR A KICKBACK-LIMITED SOFT SHUTDOWN OF A COIL," which is hereby incorporated by reference in its entirety.

Control of a coil current is disclosed in this detailed description. The control utilizes current sources to source or sink charge to a gate capacitance of switching device, such as an insulated gate bipolar transistor (IGBT), to the switching device ON or OFF. While any three terminal switching device may be used, the IGBT will be considered in the implementations described. When ON, the IGBT allows coil current to flow. The flowing coil current quickly charges to a maximum coil current. When OFF, the IGBT prevents coil current from flowing in the IGBT. The blocked coil current creates a large kickback voltage on the coil. This voltage can be coupled to a spark gap where it can exceed a breakdown voltage, causing a spark. If charge of the gate capacitance is sunk slowly (i.e., if a discharge current is small relative to the gate capacitance), the coil current may reduce gradually as the IGBT turns from ON to OFF. The disclosed circuits and methods can provide a gradual reduction of the coil current (i.e., soft shutdown) at a rate that is slow enough to reduce the kickback voltage to a level below a breakdown voltage of the spark gap so that no spark is created during a soft shutdown period. At the same time, the disclosed circuits and methods provide a gradual reduction of the coil current (i.e., soft shutdown) at a rate that is fast enough to prevent overheating the IGBT. These features can be met simultaneously by adjusting the discharge current during the soft shutdown to limit (i.e., clamp) a voltage corresponding to the coil (i.e. a collector voltage of the IGBT) to a particular value (i.e., a kickback threshold). The disclosed systems and methods may be simpler than other approaches because the soft shutdown is not based on a ramp signal generated by a ramp generator. Instead, the soft shutdown adjusting a rate of gate capacitance discharge to maintain the kickback voltage at a particular level (e.g., the kickback threshold).

FIG. 1 is a block diagram of a system for charging and discharging a coil, such as used in an ignition system for a combustion engine. The system 10 includes a battery 120 that is configured to charge a coil 110 (e.g., inductor coil, transformer coil) to a coil current ($I_C$) flowing through the coil to a ground 135. The system 10 further includes a switching device 130, such as an IGBT, to control the coil current ($I_C$) level. The switching device can be configured by a signal applied to a first terminal (i.e., controlling terminal) to increase or decrease the conduction of a current between a second terminal and a third terminal. For example, an IGBT can receive a voltage (VG) at a gate terminal 136 (i.e. gate) to control a coil current ($I_C$) flowing between a collector terminal 132 and an emitter terminal 134. Accordingly, the system includes a coil-current controller 300 that is configured, in an IGBT implementation, to drive a gate capacitance ($C_{GE}$) of the IGBT to configure the IGBT in an ON state (i.e. ON), an OFF state (i.e., OFF), or some state therebetween. The system 10 can include an engine control unit (i.e., ECU 140) that can monitor the conditions of an engine, the coil, and/or the switching device and trigger the IC controller 300 to charge or discharge the coil current ($I_C$). The discharge (i.e., shutdown) of the coil current can be a hard shutdown (HSD), in which the switching device 130 is abruptly switched from the ON state to the OFF state or can be a soft shutdown (SSD), in which the switching device 130 is gradually switched from the ON state to the OFF state. The type of shutdown can affect a kickback voltage across the coil 110, which can be sensed as a collector voltage ($V_C$) at the collector terminal 132 of the switching device.

Figure 2:
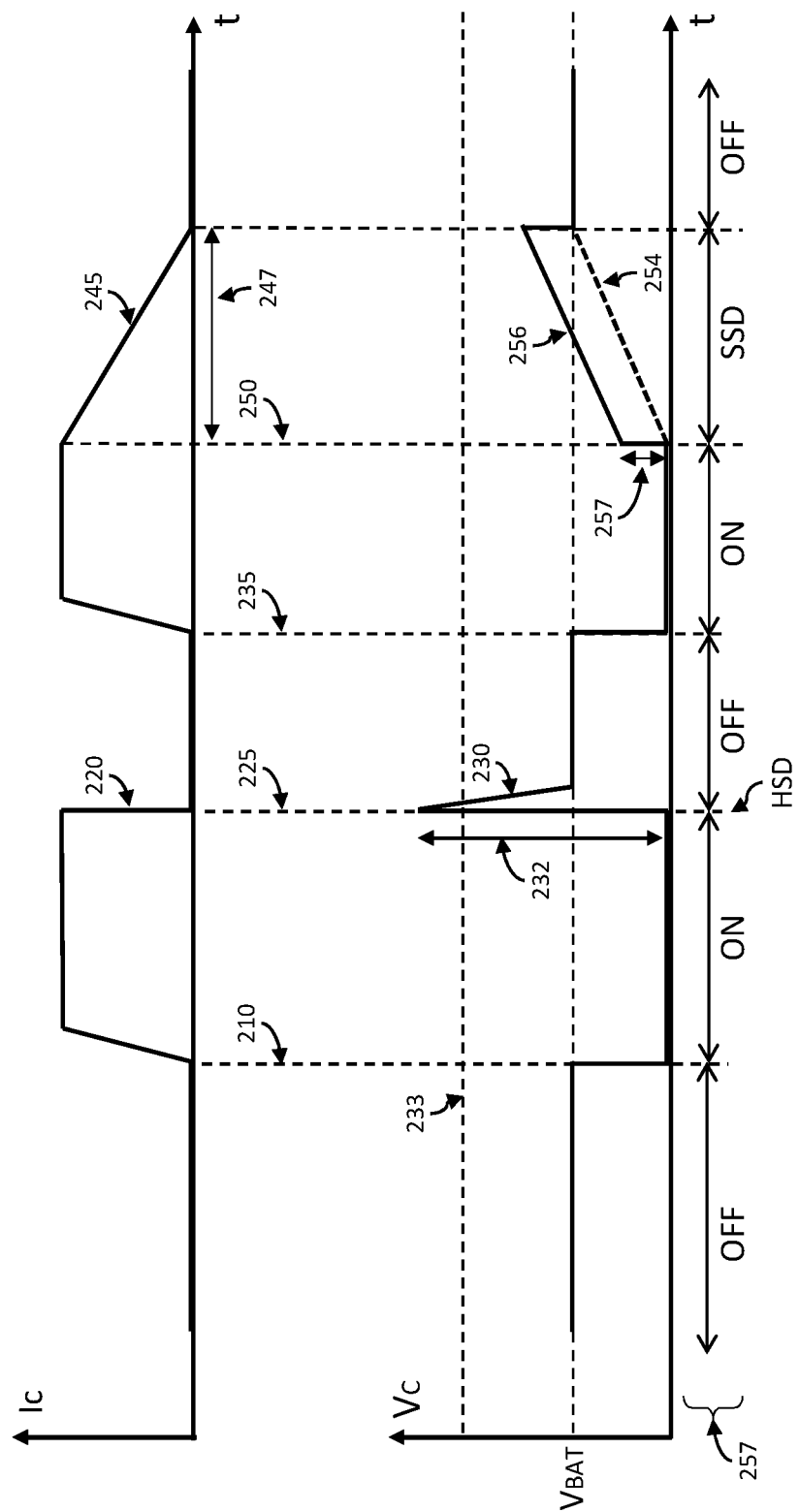
FIG. 2 includes time-synchronized graphs of example signals associated with the system of FIG. 1.

FIG. 2 includes time-synchronized graphs of example signals associated with the system 10 of FIG. 1 for various states 257 of the switching device. In particular, a coil current ($I_C$) and a collector voltage ($V_C$) related to the coil voltage (e.g., $V_{COIL}=V_{BAT}-V_C$) are graphed. At a first time 210, the switching device of the system is turned ON to charge the coil current to a maximum current level determined by system parameters, such as a coil resistance of the coil and an ON-resistance of the switching device. The switching device is turned OFF according to a hard shutdown 220 at a second time 225. The hard shutdown (HSD) generates a first kickback voltage 230 caused by the rapid discharge of the coil. In an ignition system, this first kickback voltage may have a first amplitude 232 large enough to cause a spark at a spark gap. At a third time 235, the system is again configured to charge the coil current to the maximum current level. A soft shutdown 245 occurs at a fourth time 250. The soft shutdown gradually reduces the coil current over a soft shutdown period 247. This gradual reduction of the coil current generates a second kickback voltage that has a second amplitude 257 that is much smaller than the first amplitude 232 of the first kickback voltage 230. During the soft shutdown (SSD) the collector voltage ($V_C$) is a function of the battery voltage ($V_{BAT}$), the coil current ($I_C$), the coil resistance ($R_{COIL}$) and the amplitude 257 of the kickback voltage ($V_{KICKBACK}$), and can be expressed as $V_C=V_{BAT}-(I_C \times R_{COIL})+V_{KICKBACK}$. The kickback voltage has the effect of elevating a SSD collector voltage profile 256 from a zero-kickback SSD collector voltage profile 254.

The first amplitude and the second amplitude may be compared to a kickback threshold level 233, which can be a collector voltage ($V_C$) that is predetermined (e.g., through experimentation and/or modeling) to correspond to a spark at the spark gap 114. Accordingly, an amplitude of a kickback voltage that exceeds the kickback threshold level 233 may cause a spark while an amplitude of the kickback voltage that does not exceed the kickback threshold level 233 may not cause a spark.

The amplitude of the kickback voltage corresponds to the soft shutdown period 247. Increasing the soft shutdown period 247 can reduce the amplitude 257 of the kickback voltage and thereby increase a margin of protection against an unwanted spark. Increasing the soft shutdown period 247, however, can prolong the heating of components (e.g., the switching device) by the coil current. Because a soft shutdown may be triggered to protect components from overheating, a long soft shutdown period that prolongs the heating of components may be undesirable. Accordingly, it may be simultaneously desirable to (i) shutdown a current in a charged coil gradually to prevent an unwanted spark and (ii) minimize the soft shutdown period to minimize heating. The disclosed system, circuits, and methods address both of these aspects.

A soft shutdown circuit may include a feedback loop to control a coil current. The feedback loop can include a current sensor to sense the current conducted by the switching device. The sensed current can be compared to a reference level in order to generate a drive signal to configure the switching device to increase/decrease the current in order to minimize the difference between the sensed current and the reference level. In this configuration, a soft shutdown can be accomplished by gradually reducing the reference level of the feedback loop. Accordingly, the soft shutdown circuit includes a ramp generator to generate the reference signal that is gradually reduced. The disclosed soft shutdown circuit does not require the current sensor or the ramp generator and does not use a feedback loop to control the coil current according to a profile of a ramp signal from the ramp generator.

The present disclosure describes a soft shutdown circuit configured to control a switching device to shut down a coil current ($I_C$) by discharging a gate capacitance of the switching device with a discharge current. A soft shutdown period is controlled by a rate at which the gate capacitance is discharged, and the rate at which the gate capacitance is discharged is controlled by a level of the discharge current. Accordingly, a level of the discharge current can be controlled by the kickback voltage to prevent the kickback voltage from exceeding an amplitude that could cause a spark. For example, a discharge current can be reduced as a kickback voltage is increased to limit the kickback voltage to a limited kickback level.

The disclosed soft shutdown circuit provides soft shutdown without generating a spark but does not require a ramp generator to control a reference level of a feedback loop with a current sensor. In other words, the circuit is simplified because the exact profile of the coil current during a soft shutdown period is not controlled by a ramp signal generated by a ramp generator.

Figure 3:
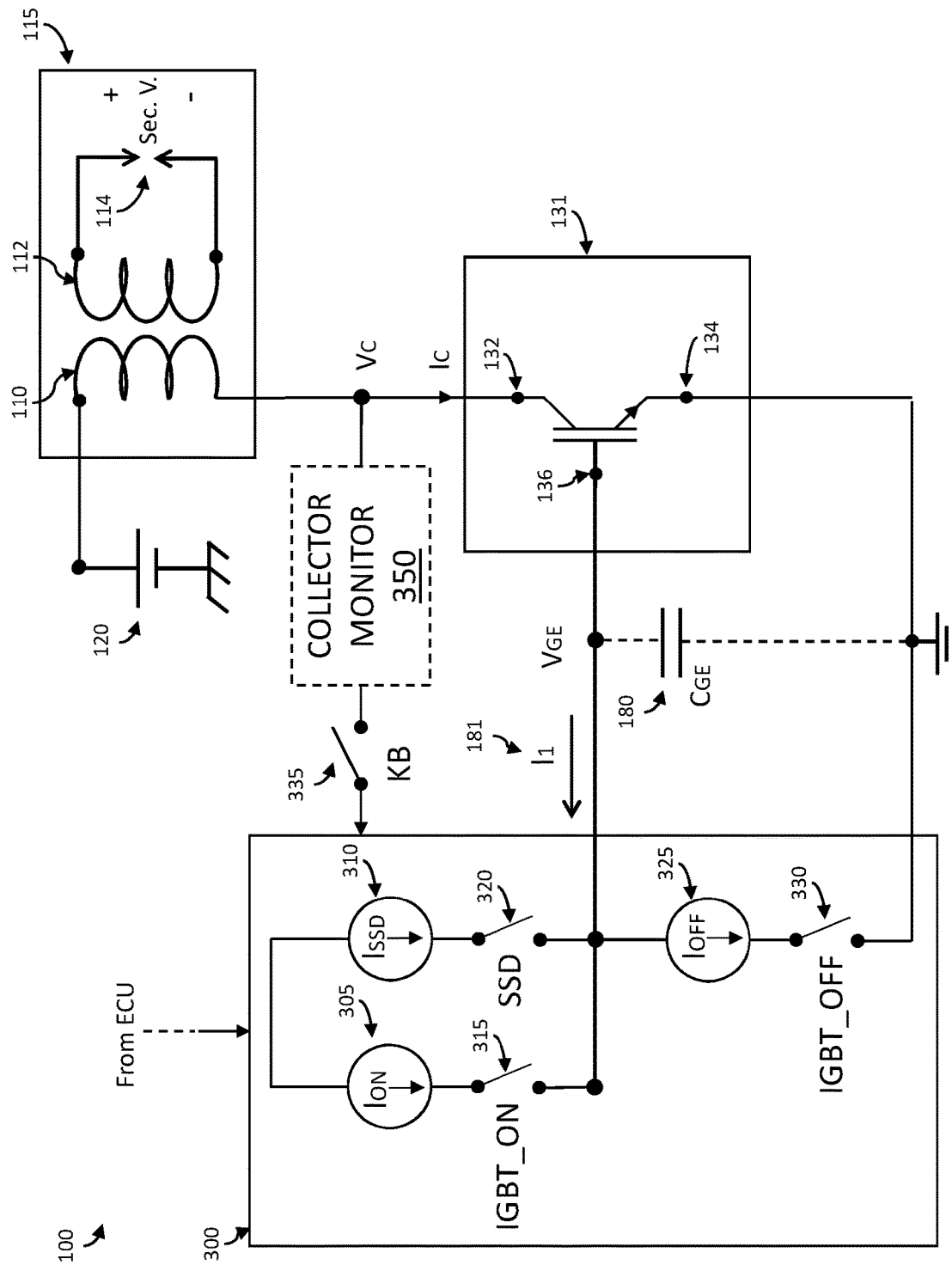
FIG. 3 schematically depicts an ignition system according to an implementation of the present disclosure.

FIG. 3 is a block diagram that schematically depicts an ignition system 100 according to an implementation of the present disclosure. The ignition system 100 includes a voltage source (e.g., battery 120) coupled to an ignition coil assembly 115. The ignition coil includes a primary winding (i.e., coil 110) and a secondary winding (i.e., secondary coil 112). The secondary coil 112 is coupled to a spark gap 114. A voltage across the coil 110 is inductively coupled and stepped-up (i.e., transformed) by a windings-ratio to produce a secondary voltage (i.e. Sec. V.) across the spark gap 114. The secondary voltage can be monitored by sensing a collector voltage ($V_C$) at a collector terminal 132 of an IGBT 131.

The ignition system 100 includes an IGBT 131. The gate 136 of the IGBT 131 has an associated gate-emitter capacitance ($C_{GE}$) (i.e., gate capacitance 180) that is fully charged when the IGBT 131 is in an ON condition, fully discharged when the IGBT is in an OFF condition, and partially changed when the IGBT is in a partially conducting condition. The IGBT 131 can be switched from an ON condition to an OFF condition by discharging a voltage of the gate capacitance (i.e. $V_{GE}$). The voltage ($V_{GE}$) can be discharged by generating a charge current to source charge to the gate capacitance or a discharge current to sink charge from the gate capacitance.

The ignition system 100 includes a coil-current controller 300. The coil-current controller 300 includes a plurality of current sources that each include a corresponding switch to couple/decouple the current source to/from a gate 136. The plurality switches and current sources can be configured to source or sink current to or from the gate capacitance.

The plurality of switches and current sources can include (i) an ON-current source 305 coupled to the gate of the IGBT by an IGBT_ON switch 315; (ii) an OFF-current source 325 coupled to the gate of the IGBT by an IGBT_OFF switch 330; and (iii) a soft-shutdown-current source (i.e., SSD-current source 310) coupled to the gate of the IGBT by an SSD switch 320. Additionally, the ignition system 100 can include a collector monitor 350, which can be coupled to the coil current controller 300 by a KB switch 335 in order to the to control at least one of the plurality current sources to limit a kickback voltage amplitude. The states of the switches can control the function of the ignition system 100, which are summarized in TABLE 1 below.

TABLE 1

| POSSIBLE SWITCH STATES FOR VARIOUS FUNCTIONS | | | | |
|---|---|---|---|---|
| | IGBT_ON | IGBT_OFF | SSD | KB |
| CHARGE | ON | OFF | OFF | OFF |
| HARD SHUTDOWN (HSD) | OFF | ON | OFF | OFF |
| SOFT SHUTDOWN (SSD) | OFF | ON | ON | OFF |
| KICKBACK-LIMITED SSD | OFF | ON | ON | ON |

The coil-current controller 300 of the ignition system 100 can be configured to increase and maintain current in the coil (i.e., a charge function). In the charge function, the IGBT 131 can be turned ON (i.e., conduct a coil current, $I_C$) by charging the gate capacitance of the IGBT to a voltage $V_{GE}$ that exceeds a threshold voltage ($V_T$) of the IGBT 131.

The coil-current controller 300 of the ignition system 100 can be configured to decrease current in a coil (i.e., a discharge function). In a discharge function, the IGBT 131 can be tuned OFF (i.e., shutdown) by reducing a gate voltage ($V_{GE}$) at a gate terminal 136 of the IGBT to below the threshold voltage ($V_T$).

The discharge function can be carried out as a hard shutdown or as a soft shutdown depending on a rate at which the gate voltage ($V_{GE}$) is reduced. The gate voltage can be reduced by sinking charge from the gate capacitance 180 ($C_{GE}$) to ground with a discharge current 181 ($I_1$). A level of the discharge current can correspond to the rate that the IGBT is turned OFF. In other words, the level of the discharge current can correspond to the rate that the coil current ($I_C$) is reduced from a maximum coil current level to zero. A level of the discharge current for a hard shutdown can be higher than a level of the discharge current for a soft shutdown.

For a hard shutdown, the coil-current controller 300 of the ignition system 100 can be configured to couple the OFF-current source 325 coupled to the gate of the IGBT. In this configuration, the discharge current is equivalent to a current level of the OFF-current source 325 (i.e., in an HSD, $I_1=I_{OFF}$). The discharge current level in this configuration may be sufficient to quickly sink all charge from the gate capacitance 180. In other words, the rate at which the discharge current sinks charge may be high relative to the capacity of charge stored by the gate capacitor ($V_{GE}$).

For a soft shutdown, the coil-current controller 300 of the ignition system 100 can be configured to couple the OFF-current source 325 and the SSD-current source to the gate of the IGBT. In this configuration, the discharge current is equivalent to a combination of the OFF-current and the SSD-current (i.e., in an SSD, $I_1=I_{OFF}-I_{SSD}$). The discharge current level in this configuration may be made small enough that the charge from the gate capacitance 180 is drained slowly (e.g., with respect to the hard shutdown). In other words, the rate at which the discharge current sinks charge may be low relative to the capacity of charge stored by the gate capacitor ($V_{GE}$).

The gate capacitance 180 of an IGBT may require a very small discharge current in order to create a soft shutdown period 247 of a length sufficient to reduce the kickback voltage to a level that is low enough (e.g., compared to a kickback threshold level 233) to prevent a spark at the spark gap 114 during the soft shutdown. The coil-current controller 300 of the present disclosure creates the very small discharge current through the use of multiple current sources ($I_{SSD}$, $I_{OFF}$). The use of a plurality of current sources may advantageously create currents at very low levels that are stable and therefore, may be desirable compared to using a single current source to create the discharge current for a soft shutdown.

Unlike soft shutdown configurations in which a soft shut down profile of the IGBT is based on a signal from a ramp generator, the soft shutdown circuit of the present disclosure shuts down the IGBT based on a discharge current ($I_1$) level. It may be desirable to set the discharge level high enough to minimize the soft shutdown period, while at the same time low enough to prevent a kickback voltage from exceeding a kickback threshold level 233 that could generate a spark at the spark gap. Accordingly, in some embodiments the ignition system includes a collector monitor circuit 350 that monitors the kickback voltage and can adjust the discharge current level by adjusting either $I_{SSD}$ or $I_{OFF}$.

Figure 4:
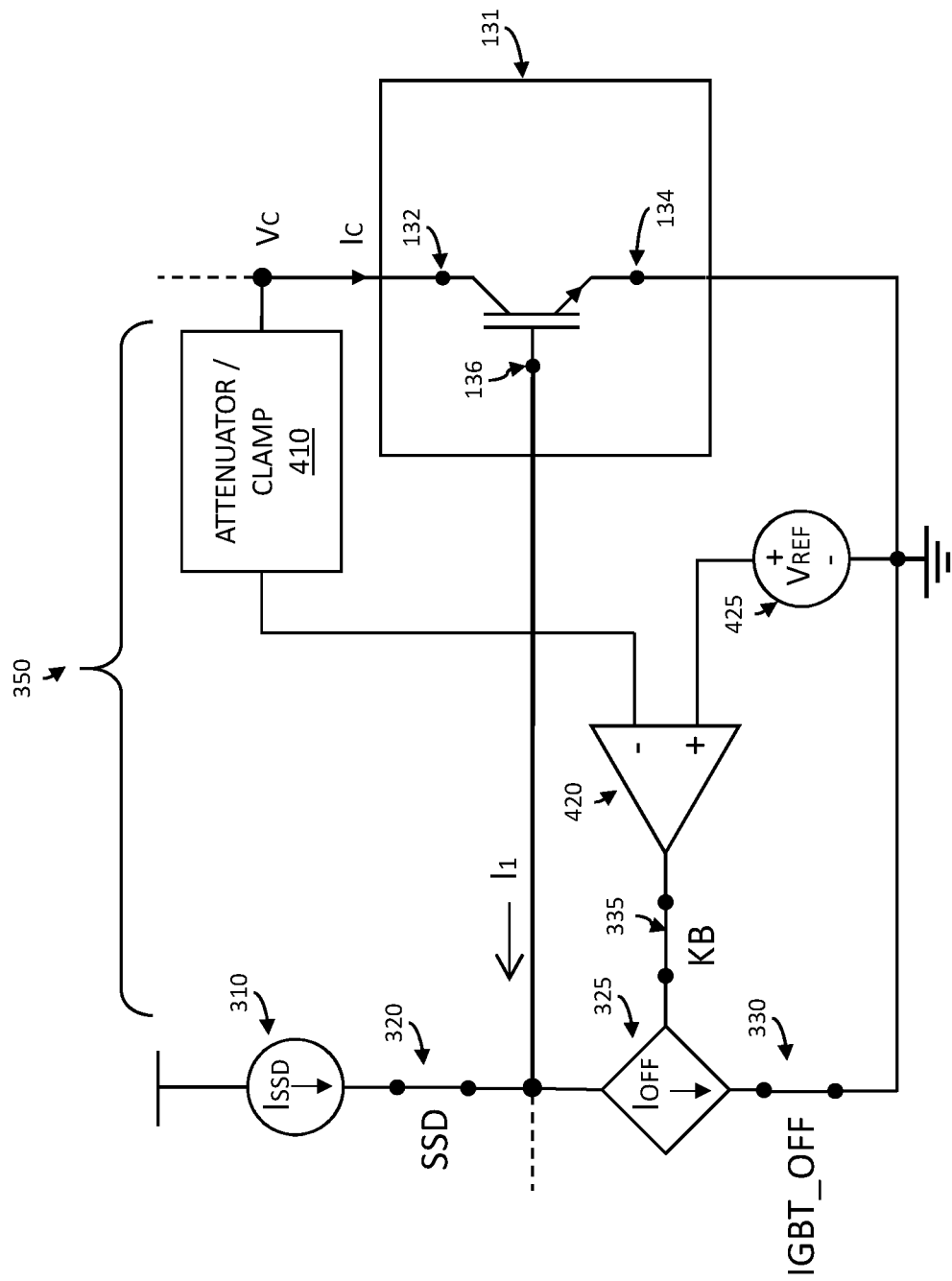
FIG. 4 schematically illustrates a first implementation of a kickback-limited soft shutdown circuit.

FIG. 4 schematically illustrates a first possible implementation of a collector monitor circuit for a kickback-limited soft shutdown. The collector monitor circuit 350 includes an attenuator/clamp circuit 410. The attenuator/clamp circuit is configured reduce a level of the collector voltage ($V_C$) by a factor (a/b) and to limit the collector voltage in order to protect subsequent circuitry. An output of the attenuator/clamp circuit 410 is coupled to an inverting input of a difference amplifier 420. The collector monitor circuit 350 also includes a reference voltage source 425 coupled to a non-inverting input of the difference amplifier 420. The reference voltage source is configured to generate a reference voltage ($V_{REF}$) corresponding to a kickback threshold level 233.

When coupled to the OFF-current source by the KB switch, an output the difference amplifier 420 (i.e. $V_{REF} - V_C \times a/b$) can control a level of OFF-current ($I_{OFF}$) to adjust the rate at which the coil current is reduced. In other words, the OFF-current source can be a voltage controlled current source generating an output current ($I_{OUT}$) at a level that corresponds to the difference between the reference voltage and the attenuated (i.e., a/b) and clamped collector voltage ($V_C$). For example, an increase in collector voltage ($V_C \times a/b$) can cause a reduction the OFF current level so that the discharge current ($I_1 = I_{OFF} - I_{SSD}$) is reduced. The reduction of the discharge current reduces the rate at which the IGBT is turned OFF (i.e., increases the soft shutdown period), which reduces the kickback voltage (e.g., to $V_{REF}$). Conversely, a decrease in the collector voltage ($V_C$) can cause an increase of the OFF current level so that the discharge current ($I_1 = I_{OFF} - I_{SSD}$) is increased. The increase of the discharge current increases the rate at which the IGBT is turned OFF (i.e., decreases the soft shutdown period), which increases the kickback voltage (e.g., to $V_{REF}$). Accordingly, the kickback voltage can be controlled to a particular value (e.g., $V_{REF}$), which can be predetermined not to cause s spark. As a result, the soft shutdown can proceed as fast a possible without causing a spark.

Figure 5:
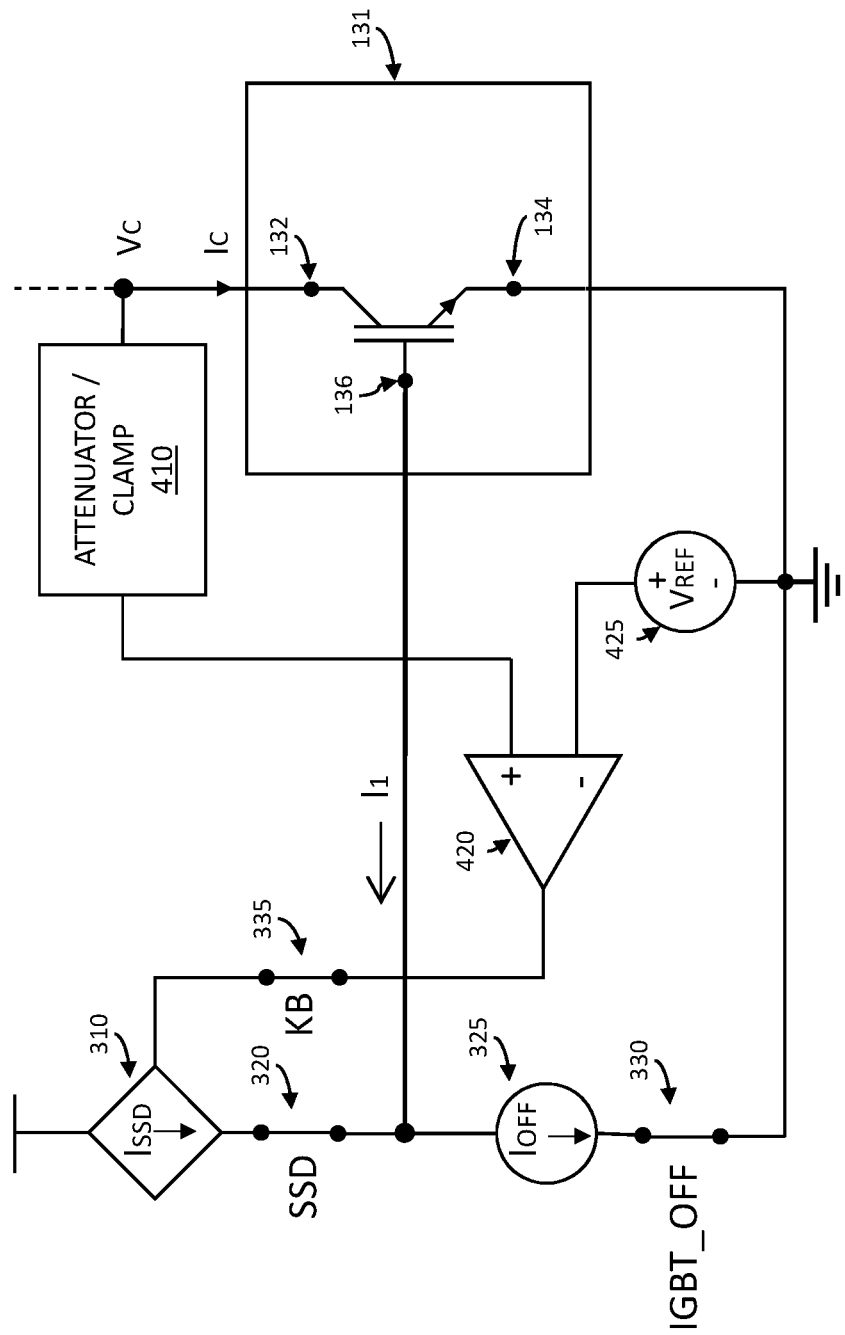
FIG. 5 schematically illustrates a second possible implementation of a kickback-limited soft shutdown circuit.

FIG. 5 schematically illustrates a second possible implementation of a collector monitor circuit for a kickback-limited soft shutdown. An output of the attenuator/clamp circuit 410 is coupled to a non-inverting input of the difference amplifier 420. The reference voltage ($V_{REF}$) of the reference voltage source 425 is coupled to the inverting input of the difference amplifier 420. An output the difference amplifier 420 (i.e. $V_C \times a/b - V_{REF}$) can control a level the SSD-current ($I_{OFF}$) to adjust the rate at which the coil current is reduced. In other words, the SSD-current source can be a voltage controlled current source generating a soft shutdown current ($I_{SSD}$) at a level that corresponds to the difference between the attenuated/clamped collector voltage ($V_C \times a/b$) and the reference voltage ($V_{REF}$). For example, an increase in collector voltage ($V_C$) can cause an increase in the SSD current level so that the discharge current ($I_1 = I_{OFF} - I_{SSD}$) is reduced. The reduction of the discharge current reduces the rate at which the IGBT is turned OFF (i.e., increases the soft shutdown period), which reduces the kickback voltage (e.g., to $V_{REF}$). Conversely, a decrease in the collector voltage ($V_C$) can cause a decrease of the SSD current level so that the discharge current ($I_1 = I_{OFF} - I_{SSD}$) is increased. The increase of the discharge current increases the rate at which the IGBT is turned OFF (i.e., decreases the soft shutdown period), which increases the kickback voltage (e.g., to $V_{REF}$). Accordingly, the kickback voltage can be controlled to a particular value (e.g., $V_{REF}$), which can be predetermined as a kickback voltage (e.g., the largest kickback voltage possible without causing a spark. As a result, the soft shutdown can proceed as fast as possible without causing a spark.

Figure 6:
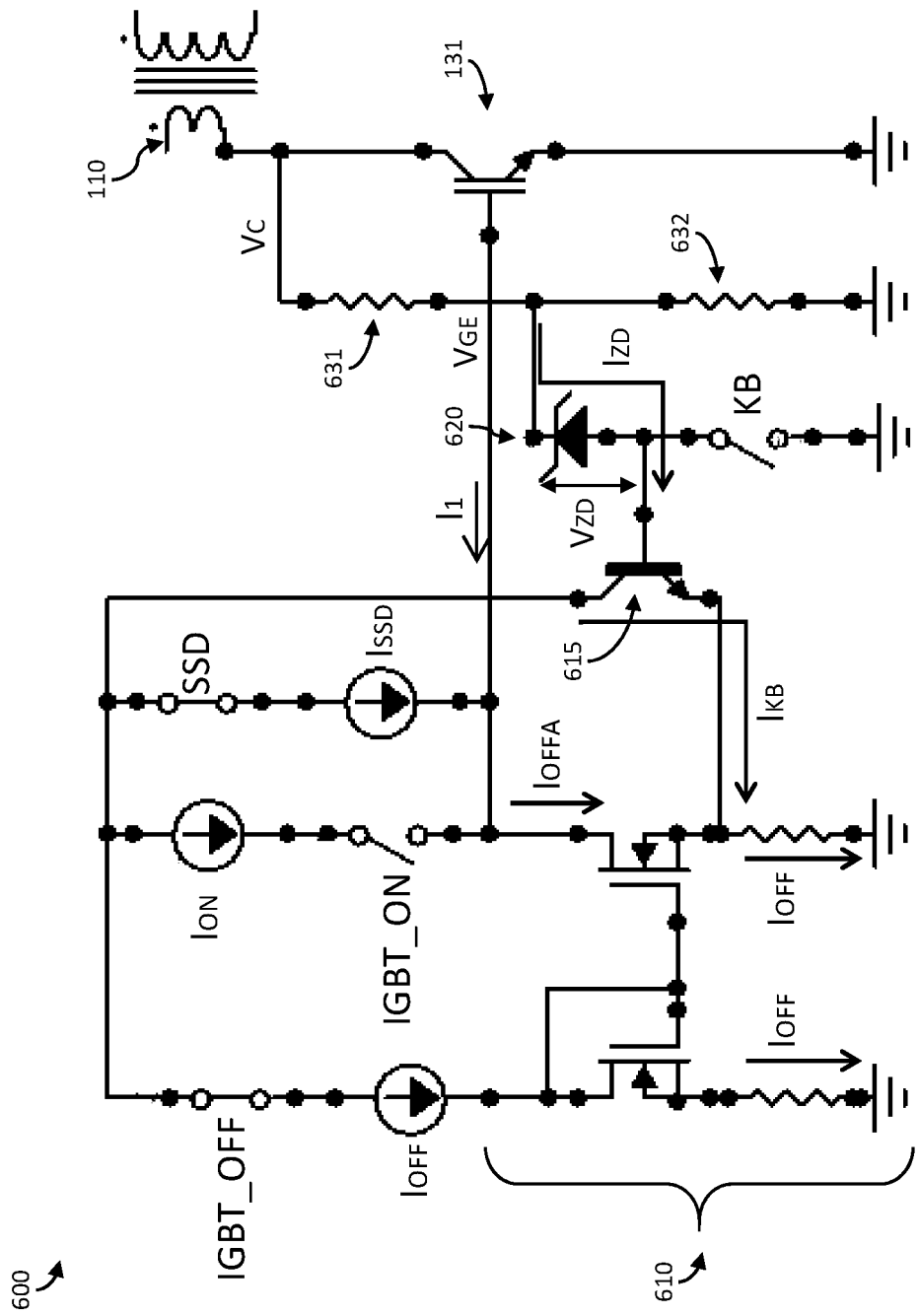
FIG. 6 is a schematic of an ignition system including details of the first implementation of the kickback-limited soft shutdown circuit of FIG. 4.

FIG. 6 is a schematic of an ignition system 600 including details of a possible implementation of the kickback-limited soft shutdown circuit of FIG. 4. As the gate voltage ($V_{GE}$) is decreased by the discharge current ($I_1$) a kickback voltage ($V_C$) is created at the collector terminal of the IGBT 131. An amplitude of the kickback voltage corresponds to rate of decrease of the gate voltage, which in turn, corresponds the discharge current ($I_1$). In the implementation shown, the discharge current ($I_1$) may be calculated by the equation below.

$$I_1 = I_{OFFA} - I_{SSD} \quad (1)$$

In equation (1) above and as shown in FIG. 6, $I_{OFFA}$ is the current in a branch of a current mirror 610 that receives (and mirrors) $I_{OFF}$ from the OFF-current source. As shown in FIG. 6

$$I_{OFFA} = I_{OFF} - I_{KB} \quad (2)$$

Equations (1) and (2) imply that the discharge current ($I_1$) may be calculated by the equation below.

$$I_1 = (I_{OFF} - I_{SSD}) - I_{KB} \quad (3)$$

$I_{KB}$ is a kickback-compensation current that is zero until $V_C$ exceeds a kickback threshold and then increase in proportion to the amount that $V_C$ exceeds the kickback threshold. In a hard shutdown, $I_{SSD}$ is blocked by the SSD switch and $I_{KB}$ is shorted by the KB switch, making each of these terms zero in equation (3). In the hard shut down condition $I_1 = I_{OFF}$ and the kickback voltage can exceed the kickback threshold to create a spark. In a soft shut down, $I_{SSD}$ is not blocked by the SSD switch and so reduces the discharge current to a value that slowly drains the gate capacitance of the IGBT. At the same time, the KB switch is opened so if the collector voltage exceeds a kickback threshold the kickback-compensation current $I_{KB}$ can be generated at a level that is comparable to the $I_{OFF} - I_{SSD}$ difference. The kickback-compensation current reduces the discharge current to slow the rate at which the IGBT is reducing the coil current ($I_C$), which reduces the kickback voltage.

The kickback-compensation current ($I_{KB}$) is generated by a subcircuit that turns a bipolar junction transistor (i.e., BJT 615) ON when an attenuated version of the collector voltage exceeds a threshold set by a Zener diode 620. The collector voltage is attenuated by a voltage divider that includes a first resistor 631 and a second resistor 632. When the divided voltage at the voltage divider exceeds a kickback threshold voltage sufficient to bias the Zener diode 620 (i.e., $V_{ZD}$), a current ($I_{ZD}$) is input to a base of the BJT 615 to turn it ON. As the BJT 615 is turned ON, the kickback-compensation current ($I_{KB}$) is generated to reduce the discharge current ($I_1$), as shown in FIG. 6 and equation (3).

Figure 7:
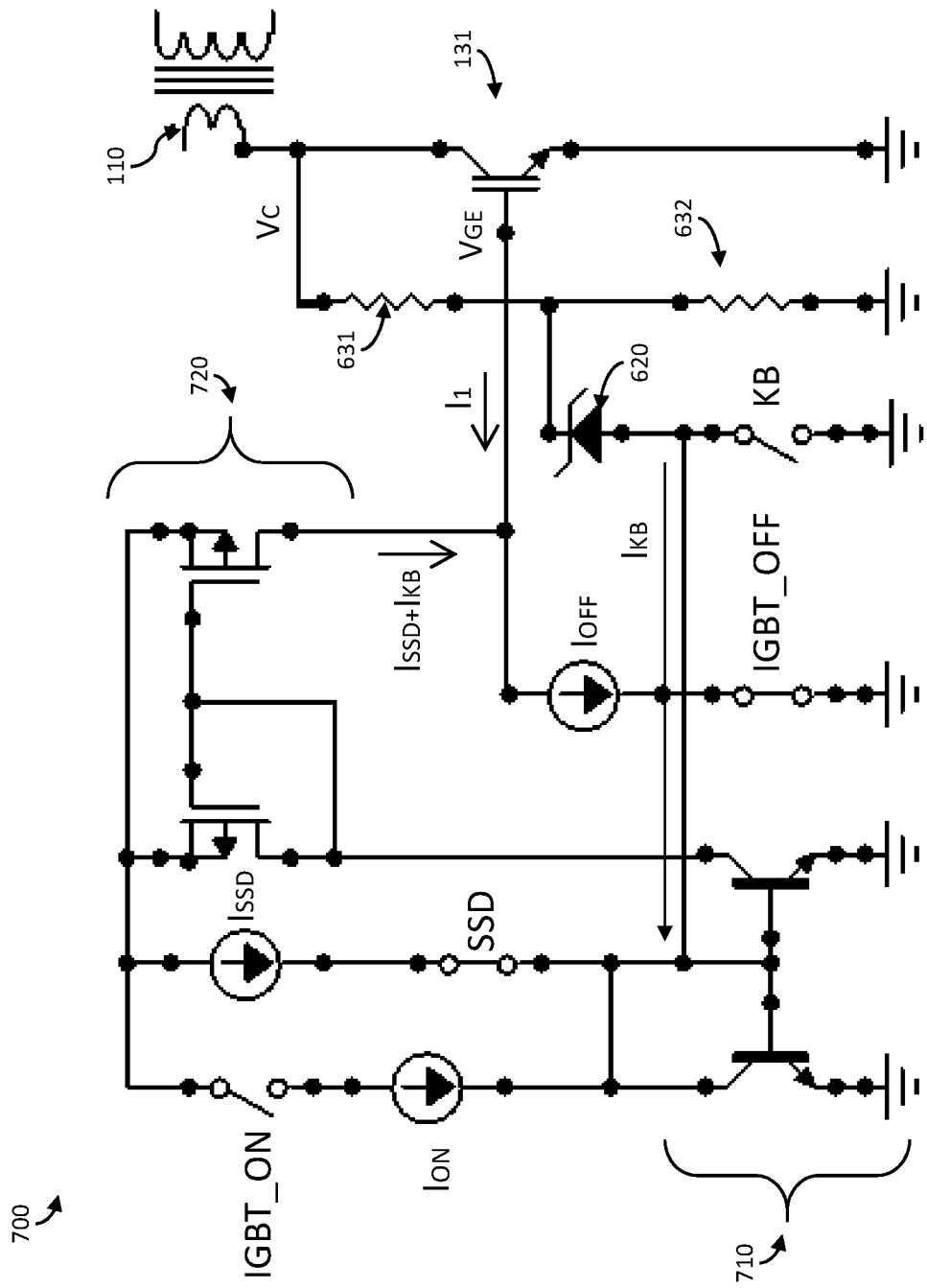
FIG. 7 is a schematic of an ignition system including details of the second implementation of the kickback-limited soft shutdown circuit of FIG. 5.

FIG. 7 is a schematic of an ignition system 700 including details of a possible implementation of the kickback-limited soft shutdown circuit of FIG. 5. As the gate voltage ($V_{GE}$) is decreased by the discharge current ($I_1$) a kickback voltage ($V_C$) is created at the collector terminal of the IGBT 131. An amplitude of the kickback voltage corresponds to rate of decrease of the gate voltage, which in turn, corresponds the discharge current ($I_1$). In the implementation shown, the discharge current ($I_1$) may be calculated by the equation below.

$$I_1 = I_{OFF} - (I_{SSD} + I_{KB}) \tag{4}$$

In a hard shutdown, $I_{SSD}$ is blocked by the SSD switch and $I_{KB}$ is shorted by the KB switch, making each of these terms zero in equation (3). In the hard shut down condition, $I_1 = I_{OFF}$ and the kickback voltage can exceed the kickback threshold to create a spark. In a soft shut down, $I_{SSD}$ is not blocked by the SSD switch and IKB is not shorted by the KB switch so if the collector voltage exceeds a kickback threshold, the kickback-compensation current $I_{KB}$ can be generated to further decrease the discharge current to slow the rate at which the IGBT is reducing the coil current ($I_C$) and reduce the kickback voltage.

The kickback-compensation current ($I_{KB}$) is generated by a subcircuit that includes a Zener diode 620 to set a kickback threshold. As shown in FIG. 7, the collector voltage ($V_C$) is adjusted by the voltage divider that includes a first resistor 631 and a second resistor 632. When the adjusted voltage at the voltage divider exceeds a kickback threshold voltage sufficient to bias the Zener diode 620 (i.e., $V_{ZD}$), a current ($I_{KB}$) is input to first current mirror 710. The kickback-compensation current ($I_{KB}$) is combined with the soft shutdown current, mirrored by the first current mirror 710, and mirrored by a second current mirror 720 to reduce the discharge current ($I_1$), as shown in FIG. 7 and equation (4).

FIG. 8 is a flowchart of a method for a soft shutdown of a coil current. The method 800 includes configuring 805 a switching device (e.g., an IGBT) to conduct a coil current (IC). As shown in FIG. 3, the coil 110 (e.g., a primary coil of an ignition assembly 115) can be coupled to a collector terminal of the IGBT 131 while an emitter terminal 134 of the IGBT 131 is coupled to a ground. Accordingly, when the IGBT is ON, the coil current ($I_C$) may flow through the IGBT from at battery coupled to the coil to the ground. A plurality of current sources may be coupled to a gate of the IGBT to turn the IGBT ON/OFF. In the method, currents from the plurality of current sources are combined 810 to generate a discharge current ($I_1$), and the discharge current can be coupled 815 to the gate 136 of the IGBT to discharge a gate capacitance of the IGBT (i.e., turn OFF the IGBT). The discharge current can be small in comparison to an amount of charge stored in the gate capacitance. As a result, the IGBT can be turned OFF over a soft shutdown period that is long relative to a hard shutdown period. During the soft shutdown period (i.e., before the IGBT is fully OFF 820), a collector voltage can be monitored (i.e., sensed) and compared 825 to a kickback threshold. For example, the kickback threshold may be a voltage below a breakdown voltage of a spark gap. Accordingly, it may be desirable to maintain a condition in which the collector voltage at or below the kickback threshold because when this condition is met, a spark at the spark gap can be prevented and/or to maintain a condition in which the coil current is reduced as quickly as possible. As a result, the method includes deciding 830 if the comparison of the collector voltage and the kickback voltage meet a condition, such as the collector voltage exceeding the kickback threshold (e.g., $V_C > V_{KB}$) or the collector voltage not exceeding the kickback threshold (e.g., $V_C \leq V_{KB}$) and adjusting 835 one or more of the plurality of current sources as a result. For example, if it is determined that the collector voltage exceeds the kickback threshold then one or more of the plurality of current sources can be adjusted to reduce the discharge current ($I_1$) when the plurality of current sources are combined. Alternatively, if it is determined that the collector voltage does not exceed the kickback threshold, then one or more of the plurality of current sources can be adjusted to increase the discharge current ($I_1$) when the plurality of current sources are combined. In this way the collector voltage, which represents the coil voltage, can be limited at a particular value. While the collector voltage is at this value no adjustment of the discharge current may be necessary.

In one aspect, the present disclosure describes a circuit configured to control a switching device to reduce a current in a charged coil while monitoring a kickback voltage generated by the decreasing current in the coil. The circuit is further configured to adjust a rate at which the current is reduced in order to limit the kickback voltage. Limiting the kickback voltage during shutdown can prevent a spark at a spark gap that is inductively coupled to the coil and can allow for greater flexibility in the time taken to shut down the coil without overheating components or generating an unwanted spark.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A circuit, comprising:
    a coil configured to conduct a coil current from a battery to a ground;
    a switching device coupled between the coil and the ground;
    a coil current controller including a plurality of current sources configured to be coupled or decoupled to a controlling terminal of the switching device to adjust a level of the coil current; and
    a collector monitor circuit configured to monitor a voltage corresponding to a kickback voltage of the coil during a soft shutdown of the coil current and adjust current from one or more of the plurality of current sources to limit the kickback voltage of the coil.

2. The circuit according to claim 1, wherein the switching device is an insulated gate bipolar transistor (IGBT) and the controlling terminal is a gate terminal of the IGBT.

3. The circuit according to claim 2, wherein a gate voltage at the gate terminal of the IGBT corresponds to a charge of a gate capacitance, the charge of the gate capacitance is controlled by the plurality of current sources.

4. The circuit according to claim 2, wherein the plurality of current sources includes an OFF-current source and a soft-shutdown-current source.

5. The circuit according to claim 4, wherein:
    the OFF-current source is coupled to the gate terminal of the IGBT during a hard shutdown of the coil current; and
    the OFF-current source and the soft-shutdown-current source are coupled to the gate terminal of the IGBT during a soft shutdown of the coil current.

6. The circuit according to claim 5, wherein an OFF current from the OFF-current source and a soft shutdown current from the soft-shutdown-current source combine at the gate terminal of the switching device to generate a discharge current that has a level corresponding to a difference between the OFF current and the soft shutdown current and wherein a rate of the soft shutdown of the coil current corresponds to the level of the discharge current.

7. The circuit according to claim 6, where a period of the soft shutdown corresponds to a gate capacitance of the IGBT and the level of the discharge current.

8. The circuit according to claim 6, wherein the collector monitor circuit is configured to compare a collector voltage at a collector of the IGBT to a kickback threshold voltage.

9. The circuit according to claim 8, wherein the collector monitor circuit is configured to adjust the OFF current or the soft shutdown current to increase the discharge current when the collector voltage is below the kickback threshold voltage, the increase of the discharge current corresponding to a reduction of a soft shutdown period.

10. The circuit according to claim 8, wherein the collector monitor circuit is configured to adjust the OFF current or the soft shutdown current to decrease the discharge current when the collector voltage is above the kickback threshold voltage, the decrease of the discharge current corresponding to a reduction of the kickback voltage.

11. A method for shutting down a coil current in a coil, the method comprising:
    configuring an insulated gate bipolar transistor (IGBT) to conduct the coil current;
    combining a plurality of current sources to generate a discharge current;
    coupling the discharge current to a gate of the IGBT to discharge a gate capacitance;
    reducing the coil current conducted by the IGBT according to discharge of the gate capacitance;
    comparing, while the coil current is being reduced, a voltage of the IGBT to a kickback threshold voltage to obtain a comparison; and
    adjusting, based on the comparison, one or more of the plurality of current sources to change the discharge current.

12. The method for shutting down a coil current in a coil according to claim 11, wherein the discharge current is changed to limit a kickback voltage of the coil.

13. The method for shutting down a coil current in a coil according to claim 12, wherein the kickback voltage of the coil is limited to a voltage that is less than a breakdown voltage of a spark gap that is inductively coupled to the coil.

14. The method for shutting down a coil current in a coil according to claim 11, wherein a period of a soft shutdown of the coil current corresponds to the discharge current.

15. The method for shutting down a coil current in a coil according to claim 11, wherein the plurality of current sources includes an OFF-current source that generates an OFF current and a soft-shutdown-current source that generates a soft shutdown current and wherein the discharge current corresponds to a difference between the OFF current and the soft shutdown current.

16. The method for shutting down a coil current in a coil according to claim 15, wherein the adjusting includes:
    when a collector voltage at a collector of the IGBT is below the kickback threshold voltage, adjusting the OFF current or the soft shutdown current to increase the discharge current; and
    when a collector voltage at a collector of the IGBT is above the kickback threshold voltage, adjusting the OFF current or the soft shutdown current to reduce the discharge current.

17. The method for shutting down a coil current in a coil according to claim 11, wherein the adjusting includes:
    determining a difference between a collector voltage of the IGBT and the kickback threshold voltage and increasing or decreasing current from one or more of the plurality of current sources in proportion to the difference.

18. An ignition system comprising:
    an ignition assembly including a primary coil inductively coupled to a secondary coil, the secondary coil in series with a spark gap;
    an insulated gate bipolar transistor (IGBT) coupled between the primary coil and a ground, the IGBT configurable to control a coil current in the primary coil; and a coil-current controller including a plurality of switches configured to couple a plurality of current sources to a gate of the IGBT during a soft shutdown of the coil current, the plurality of current sources combining to generate a discharge current to reduce a gate voltage on a gate capacitance of the IGBT over a soft shutdown period, the coil current corresponding to the voltage on the gate capacitance.

19. The ignition system of claim 18, further comprising:
a collector monitor circuit that is coupled to the coil-current controller during a soft shutdown, the collector monitor circuit configured to adjust current from one of the plurality of current sources to limit a kickback voltage during the soft shutdown.

20. The ignition system of claim 19, wherein the kickback voltage is limit to a value that is below a breakdown voltage of the spark gap and corresponds to a period of the soft shutdown that prevents overheating of the IGBT.

21. The ignition system of claim 19, further comprising an engine control unit configured to control the switches in the coil-current controller to charge the coil current or to discharge the coil current, the discharge of the coil current being defined according to a hard shutdown or a soft shutdown.

* * * * *